(12) United States Patent
Li (10) Patent No.: US 9,466,561 B2
(45) Date of Patent: Oct. 11, 2016

(54) PACKAGED SEMICONDUCTOR DEVICE FOR HIGH PERFORMANCE MEMORY AND LOGIC

(75) Inventor: Ming Li, Fremont, CA (US)

(73) Assignee: Rambus Inc., Sunnyvale, CA (US)

( * ) Notice: Subject to any disclaimer, the term of this patent is extended or adjusted under 35 U.S.C. 154(b) by 713 days.

(21) Appl. No.: 13/387,702

(22) PCT Filed: Jul. 29, 2010

(86) PCT No.: PCT/US2010/043788
§ 371 (c)(1),
(2), (4) Date: Apr. 2, 2012

(87) PCT Pub. No.: WO2011/017202
PCT Pub. Date: Feb. 10, 2011

(65) Prior Publication Data
US 2012/0187578 A1  Jul. 26, 2012

Related U.S. Application Data (60) Provisional application No. 61/231,973, filed on Aug. 6, 2009.

(51) Int. Cl.
*H01L 23/498* (2006.01)
*H01L 23/13* (2006.01)
(Continued)

(52) U.S. Cl.
CPC ......... *H01L 23/49827* (2013.01); *H01L 23/13* (2013.01); *H01L 23/49822* (2013.01); *H01L 25/18* (2013.01); *H01L 23/36* (2013.01); *H01L 24/48* (2013.01); *H01L 24/73* (2013.01); *H01L 2224/16145* (2013.01); *H01L 2224/16146* (2013.01); *H01L 2224/16225* (2013.01); *H01L 2224/16227* (2013.01); *H01L 2224/32145* (2013.01); *H01L 2224/32225* (2013.01); *H01L 2224/48227* (2013.01); *H01L 2224/73253* (2013.01); *H01L 2224/73265* (2013.01); *H01L 2225/06517* (2013.01);
(Continued)

(58) Field of Classification Search
CPC .................. H01L 2224/16; H01L 23/481
See application file for complete search history.

(56) References Cited

U.S. PATENT DOCUMENTS 7,098,070 B2   8/2006   Chen et al. ................ 438/106
7,327,020 B2   2/2008   Kwon et al. ............... 257/686
(Continued)

OTHER PUBLICATIONS

Response to Office Action (PCT/RO/132), dated Aug. 12, 2010, with mail date of Sep. 2, 2010, for PCT Application No. US2010/043788. 2 pages.
(Continued)

*Primary Examiner* — Fernando L Toledo
*Assistant Examiner* — Neil Prasad
(74) *Attorney, Agent, or Firm* — Lance Kreisman; Peninsula Patent Group (57) ABSTRACT

A packaged semiconductor device is disclosed. The device comprises a substrate having multiple layers between first and second oppositely disposed faces, and a cavity with an opening at the first face to nest at least one integrated circuit memory device. Logic circuitry is disposed on the second face and includes contacts for electrically coupling to the stacked integrated circuit memory devices. The logic circuitry is coupled to electrical contacts formed on the first face through first electrical paths formed in the multiple layers of the substrate, the first electrical paths including conductive traces and vias.

28 Claims, 5 Drawing Sheets

(51) Int. Cl.
*H01L 25/18* (2006.01)
*H01L 23/36* (2006.01)
*H01L 23/00* (2006.01)

(52) U.S. Cl.
CPC ............... *H01L 2225/06565* (2013.01); *H01L 2225/06572* (2013.01); *H01L 2225/06589* (2013.01); *H01L 2924/14* (2013.01); *H01L 2924/1433* (2013.01); *H01L 2924/15153* (2013.01); *H01L 2924/15311* (2013.01); *H01L 2924/15321* (2013.01); *H01L 2924/15331* (2013.01); *H01L 2924/181* (2013.01); *H01L 2924/3011* (2013.01)

(56) References Cited

U.S. PATENT DOCUMENTS

| | | | | |
|---|---|---|---|---|
| 7,364,945 | B2 | 4/2008 | Shim et al. | 438/109 |
| 7,489,025 | B2 | 2/2009 | Chen et al. | 257/678 |
| 8,067,308 | B2 * | 11/2011 | Suthiwongsunthorn et al. | 438/618 |
| 8,263,434 | B2 * | 9/2012 | Pagaila et al. | 438/109 |
| 8,587,129 | B2 * | 11/2013 | Chi et al. | 257/776 |
| 8,604,603 | B2 * | 12/2013 | Lau et al. | 257/693 |
| 8,643,163 | B2 * | 2/2014 | Shim et al. | 257/686 |
| 2003/0207515 | A1 | 11/2003 | Tan et al. | 438/200 |
| 2004/0157361 | A1 | 8/2004 | Jiang | 438/106 |
| 2005/0189655 | A1 | 9/2005 | Furukawa et al. | 257/762 |
| 2008/0106861 | A1 | 5/2008 | Jafari et al. | 361/684 |
| 2008/0272477 | A1 * | 11/2008 | Do et al. | 257/686 |
| 2008/0283992 | A1 | 11/2008 | Palaniappan et al. | 257/686 |
| 2009/0014856 | A1 * | 1/2009 | Knickerbocker | 257/680 |
| 2009/0065920 | A1 | 3/2009 | Ahn et al. | 257/686 |
| 2011/0024888 | A1 * | 2/2011 | Pagaila | H01L 23/13 257/686 |
| 2012/0043668 | A1 * | 2/2012 | Refai-Ahmed et al. | 257/777 |

OTHER PUBLICATIONS

International Search report and the Written Opinion dated Feb. 23, 2011 re Int'l Application No. PCT/US2010/043788. 9 Pages.
International Preliminary Report on Patentability (Chapter I) and Written Opinion mailed Feb. 16, 2012 re Int'l Application No. PCT/US10/043788. 5 pages.

* cited by examiner

PACKAGED SEMICONDUCTOR DEVICE FOR HIGH PERFORMANCE MEMORY AND LOGIC

CROSS-REFERENCE TO RELATED APPLICATIONS/TECHNICAL FIELD

Pursuant to 35 U.S.C. §365, this application claims priority from International Application No. PCT/US2010/043788, published as WO 2011/017202 A2 on Feb. 10, 2011, which claims priority from U.S. Provisional Application No. 61/231,973, filed Aug. 6, 2009 and entitled "Packaged Semiconductor Device For High Performance Memory and Logic". International Application No. PCT/US2010/043788 and U.S. Provisional Application No. 61/231,973 are hereby incorporated by reference in their entirety.

The disclosure herein relates to semiconductor memories and more particularly to packaging architectures and methods for semiconductor memories.

BACKGROUND

Data storage and retrieval plays a key role in data processing tasks. Minimizing the delay, or latency, associated with memory operations in this regard is an important goal in system design. A variety of solutions exist to manage latency with varying degrees of success. Generally speaking, the shorter the bus between a memory device and its associated memory controller, the shorter the latency.

One way to minimize latency involves employing data cache structures on the processor requesting the data. With the use of the cache structure, data with a high probability of being reused soon after storage may be held in a local on-chip cache to allow quick retrieval. In contrast, data with a lower probability of being reused soon after storage may be stored in an off-chip memory, such as a DRAM array. Data stored in the off-chip memory may generally take several clock cycles to retrieve.

While conventional on-chip cache structures provide benefits in certain applications, space and cost concerns generally restrict the storage capacity of on-chip caches. Consequently, data held in a cache cannot be held there for long. They are quickly replaced in the cache by other data and sent out to off-chip memory (e.g., main memory). What is needed is an apparatus and method to combine the low-latency benefits of an on-chip cache memory with the cost and capacity of off-chip memory.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION

Figure 1:
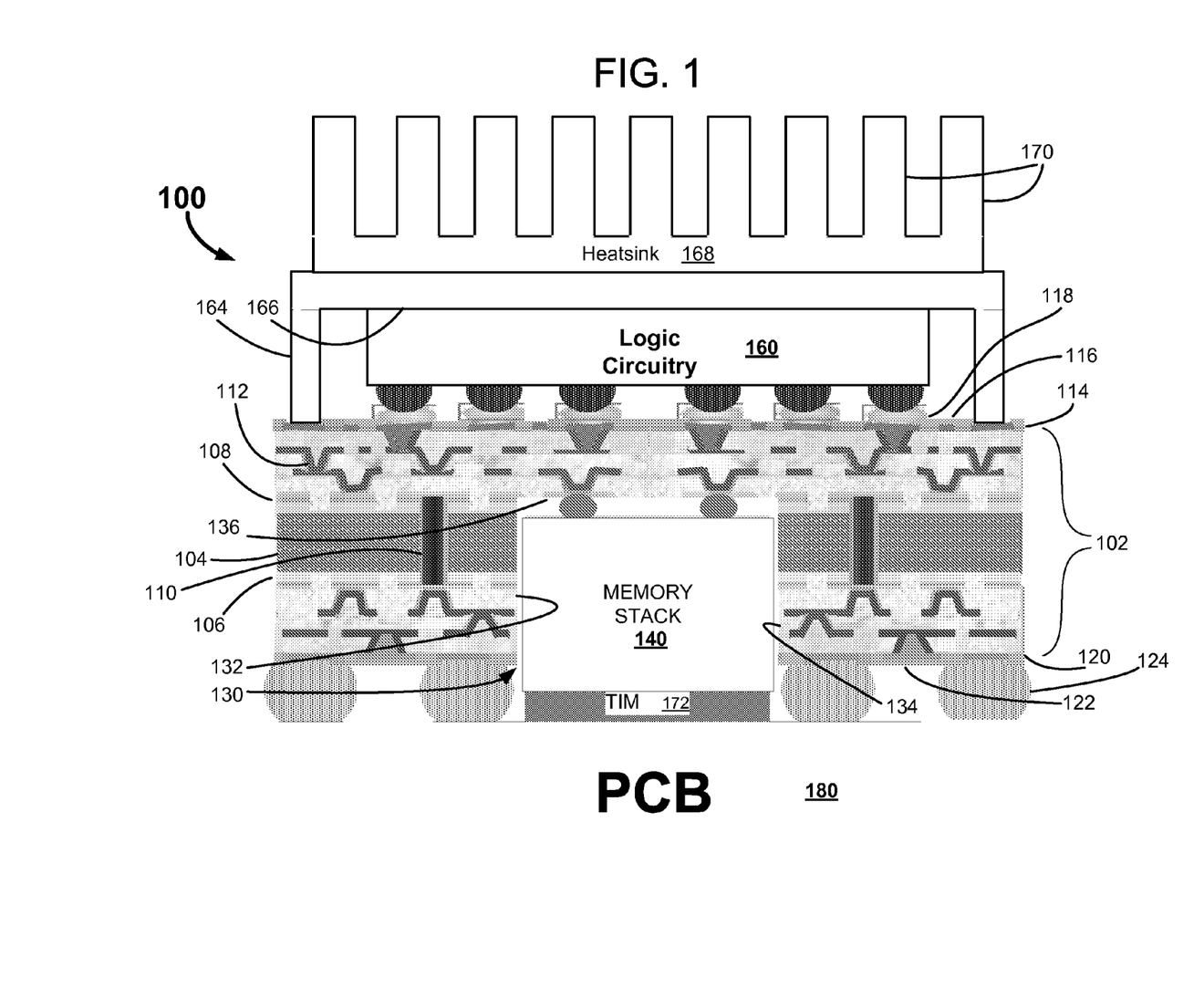
FIG. 1 shows a cross-sectional view of an embodiment of a packaged semiconductor device.

Referring now to FIG. 1, a packaged semiconductor device 100 is shown to include a multi-layered substrate 102 for mounting both logic circuitry (such as an application specific integrated circuit (ASIC)) 160 and at least one integrated circuit memory device 140. As will be further described in detail below, the substrate is formed with a cavity to nest the memory device in a stacked proximal relation to the logic circuitry. By positioning the memory device in this way with respect to the logic circuitry, a beneficial footprint may be obtained for the assembly while minimizing latency between the memory device and the logic circuitry.

With continued reference to FIG. 1, in one embodiment the substrate 102 takes the form of a laminated structure having multiple layers between two oppositely disposed faces 116 and 122. The multiple layers include at least one core layer 104, and at least two laminate layers 106, 108 on opposite sides of the core layer. The layers generally include etched conductors (not shown) for routing signals. Vias, such as those at 110 and 112 are formed through each layer and provide layer-to-layer electrical interconnections. A top layer 114 of the substrate includes a surface 116 formed with a contact interface 118 to flip-chip mount the integrated circuit containing the logic circuitry 160. A bottom layer 120 of the substrate has a surface 122 having an array of electrical contacts (e.g., a solder pad array) 124 formed thereon for interfacing the packaged device to external electrical connections (e.g., a printed circuit board (PCB) substrate) 180.

Further referring to FIG. 1, the substrate 102 is formed with a polygonal-shaped cavity 130 that opens toward the printed circuit board 180. Forming a boundary for the cavity, the substrate includes vertically extending walls 132 and 134 that blindly terminate in a horizontally disposed contact interface 136. The contact interface employs a contact configuration that allows it to align with corresponding contacts formed in an array disposed on the memory device 140.

Generally speaking, the cavity depth depends on the desired number of substrate layers separating the memory device 140 from the logic circuitry 160. Having at least two remaining layers between the memory device 140 and the logic circuitry 160 allows for signal routing and redistribution between the memory device interface and the logic circuitry interface. In some applications, this may provide a flexibility benefit in that any ASIC pinout design may be used with any memory pinout design. Routing signals between the two then merely involves a packaging design effort for the remaining substrate layers.

In some applications, however, where minimal latency and manufacturing costs are of utmost importance, the cavity depth may extend entirely through the substrate 102, enabling the memory device to be face-to-face flip-chip mounted to the logic circuitry. While this may provide manufacturing savings (as described further below), the flexibility in mixing and matching logic circuitry embodied by ASICs with memory devices may be curtailed.

Figure 2A:
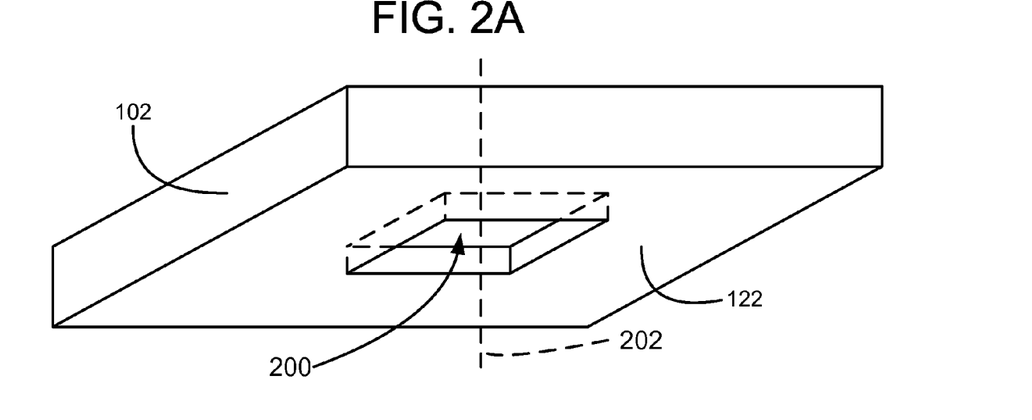
FIGS. 2A-2C illustrate alternate embodiments of a substrate having a formed cavity similar to the substrate in FIG. 1.

Referring now to FIGS. 2A-2C, variations in the cavity shape and position are possible, depending on the application. FIG. 2A shows a cavity 200 similar to that described above in FIG. 1, in a three-dimensional representation looking from below the bottom face 122 (FIG. 1) of the substrate 102. For applications benefitting from symmetrical electrical path routing, the cavity is formed centrally in the substrate. A central axis 202 through the cavity 200 coincides axially with the center of the ASIC 160 (FIG. 1) to easily match signal path lengths between the devices. Signal path matching is often a concern for memory systems, and symmetrically positioning the cavity in the substrate in this manner alleviates these concerns.

Figure 2B:
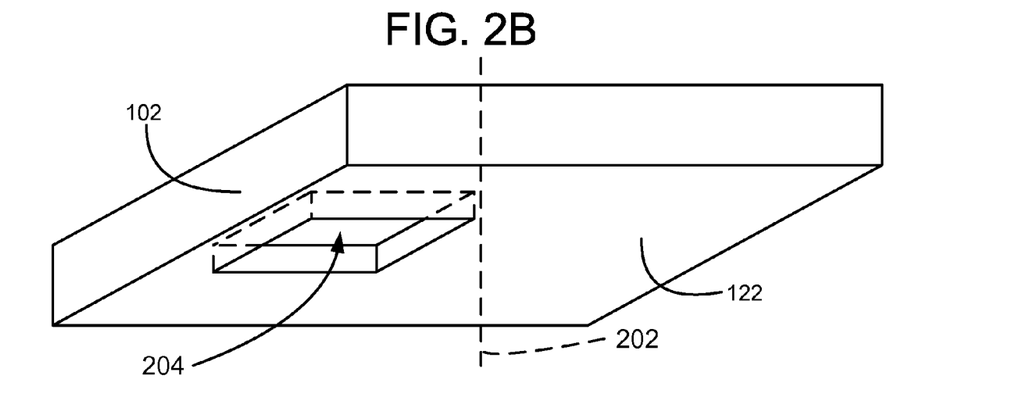

In some instances, offsetting the cavity to one side of the substrate with respect to the central axis 202 may provide benefits in routing. FIG. 2B illustrates a cavity 204 offset laterally from the central axis. The available space on the opposite side of the substrate enables the formation of via arrays suitable for power and ground routing. Generally, such arrays employ vias having significantly larger aspect ratios that require increased pitch spacing and so on.

Figure 2C:
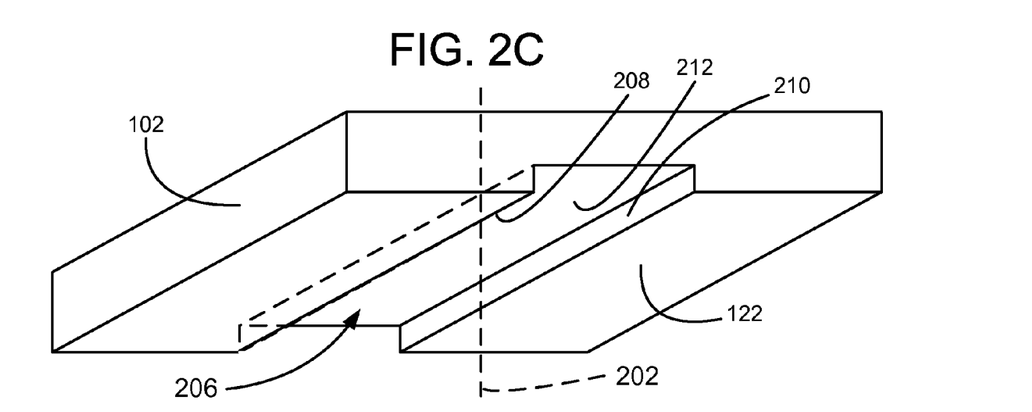

FIG. 2C shows a cavity 206 shaped into a formed channel with confronting side walls 208 and 210 and a mounting surface 212 extending longitudinally across the substrate 102. The longitudinal channel enables the cost-effective installation of multiple stacks of memory devices. This embodiment is particularly useful if additional memory capacity is desired beyond a single memory device stack to support the logic circuitry. As is the case with all of the embodiments described above, the cavity depth may extend completely through the substrate.

Figure 3:
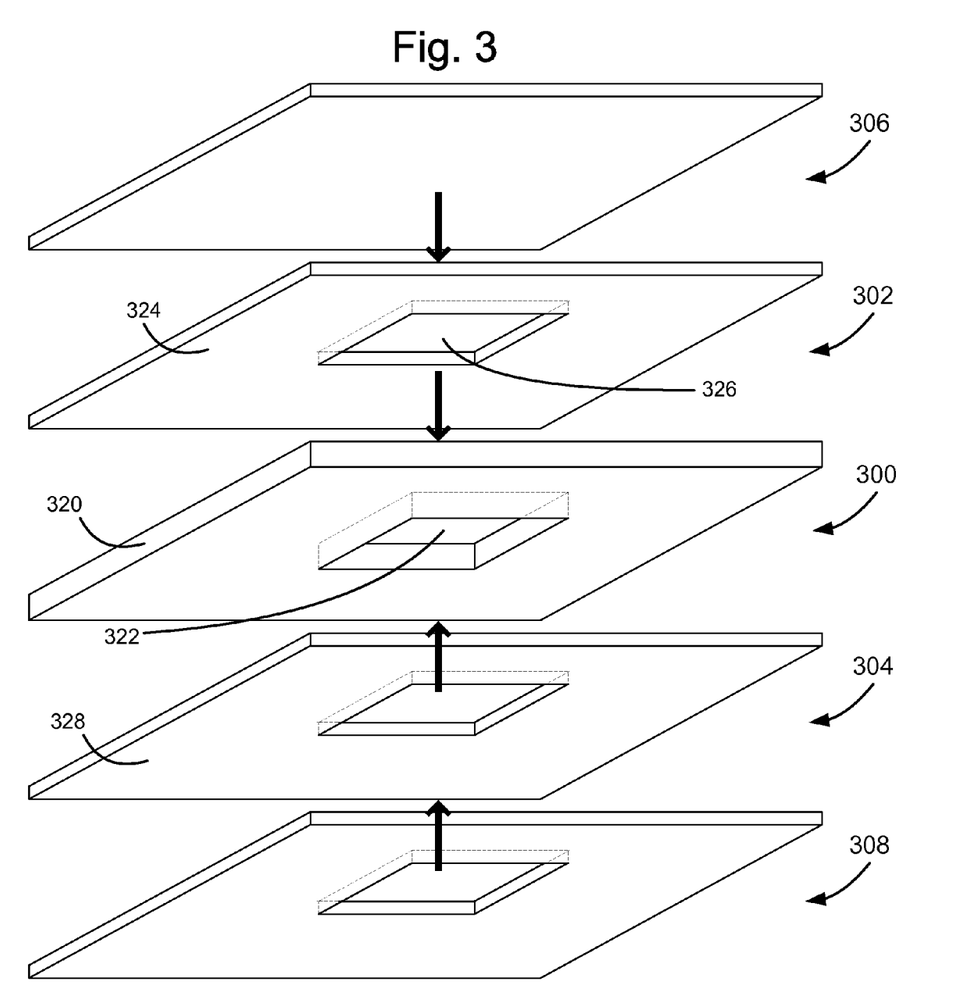
FIG. 3 illustrates one embodiment of an exploded build-up for the substrate of FIG. 1.

FIG. 3 illustrates an exploded view of the substrate 102 according to one embodiment that employs a laminated core build-up process. In general, electrical routing paths are predefined by computer-generated "artwork" prepared in advance such that the electrical paths may be etched for each layer during fabrication with the help of masking tools. To account for the absence of any routing space within the cavity, all artwork is designed for routing outside of a window corresponding to the horizontal two-dimensional cavity measurements (generally, a rectangle).

Further referring to FIG. 3, to build-up the substrate, a core layer 320 is presented, at 300, and exposed to a laser (not shown) to precisely cut a rectangular window 322 corresponding to the horizontal length and width cavity dimensions. Following the window formation through the core, a first upper layer 324 is prepared for lamination to the top surface of the core. Similar to the core layer, a laser burns a window 326 corresponding to the lateral cavity dimensions. Once the window is formed, the layer is laminated to the surface of the core with the respective windows registered in precise alignment, at 302. A similar preparation and lamination procedure is then performed for a first lower layer 328, at 304. Additional layers may then alternately be applied, at 306 and 308 to continue the build-up.

In an alternate embodiment, and suggested above, the cavity may be formed entirely through the laminated substrate, rather than formed in a "blind" configuration. Generally speaking, the build-up of the layers on each side of the core is performed, followed by the cavity formation. This minimizes manufacturing complexity and associated costs by enabling the cutting laser to perform the cutting process in a single step, burning through the entire substrate. This also avoids the cost of precision registration tools used to align the window edges atop one another.

The substrate 102 may take many forms other than the laminated structure described above. For example, a ceramic material may be employed to form a multi-layered substrate, or a polyimide material. Further, one or more of the layers may include a silicon interposer to interface signals between the memory stack and the logic circuitry. Additionally, the core layer may be omitted in favor of a coreless structure.

Referring back to FIG. 1, the memory device 140 in one form comprises a plurality of memory devices arranged in a stack that nests within the cavity 130 in a manner that enables it to communicate with the logic circuitry 160 with minimal latency. In one embodiment, memory-related signals such as command/address, data, and timing references between the memory stack and the logic circuitry are routed directly through the remaining layers of the substrate adjacent the cavity contact interface 136. Other signals, such as power and ground, may be routed from the PCB substrate 180, to the logic circuitry, via connections through the part of the first substrate 102 around the cavity 130.

Figure 4A:
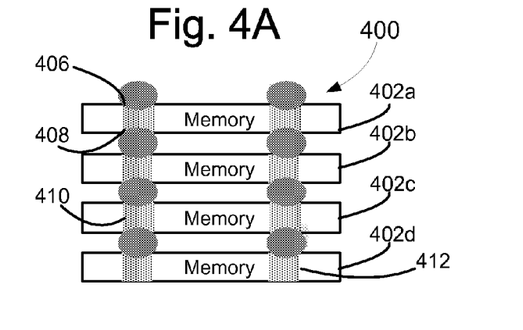
FIGS. 4A-4D illustrate cross-sectional views of various embodiments of the memory stack shown in FIG. 1.

Referring now to FIG. 4A, one embodiment of a memory stack 400 suitable for nesting in the substrate cavity 130 (FIG. 1) comprises a plurality integrated circuit memory devices 402a-402d vertically mounted along a common axis to define a stacked assembly. Each device exhibits respective top and bottom contact arrays 406 and 408 for coupling with solder ball connections disposed between adjacent devices. Through-vias (represented by vertical structures at 410 and 412) formed in the silicon of each device allow signals to propagate from device to device without the need for external wirebond connections or the like. To interface the memory stack with the contact interface disposed in the cavity, the contact array 406 for the top memory device 402a is configured to connect to the cavity contact interface 136 (FIG. 1). This architecture provides an optimum low-profile stack for insertion within the substrate cavity.

While the memory devices described in the various memory stack embodiments generally take the form of dynamic random access memory (DRAM) devices, other forms of integrated circuit memory devices may be employed, such as non-volatile (flash) memory.

Figure 4B:
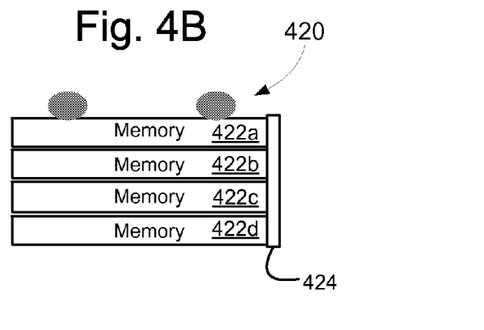

FIG. 4B illustrates an alternative embodiment of a memory stack 420 that employs multiple integrated circuit memory devices 422a-422d, but avoids the use of silicon through-vias, and instead routes signals off-chip to a vertical interface 424 formed on one side of the stacked assembly. Signals from each memory device are redistributed to the vertical interface via redistribution layers (not shown). The interface may either connect to a corresponding connection formed in the cavity contact interface 136 (FIG. 1) or couple to a vertically disposed connector (not shown) disposed on the corresponding side wall 134 (FIG. 1) of the cavity.

Figure 4C:
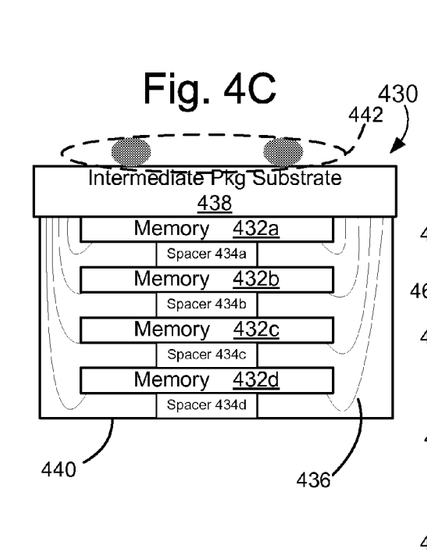

In another embodiment, shown in FIG. 4C, a memory stack 430 takes the form of a stacked wirebond package. As in the other embodiments, multiple IC memory devices 432a-432d lie vertically stacked along a common axis. Spacers 434a-434d positioned between each adjacent memory device form offsets that enable bond wires 436 to connect each device to an intermediate package substrate 438. A housing 440 filled with epoxy encapsulates the memory stack assembly to protect the bond wire arrangement. The opposite side of the intermediate substrate mounts a solder ball array 442 that matches the contact pitch of the cavity contact interface 136 (FIG. 1).

Figure 4D:
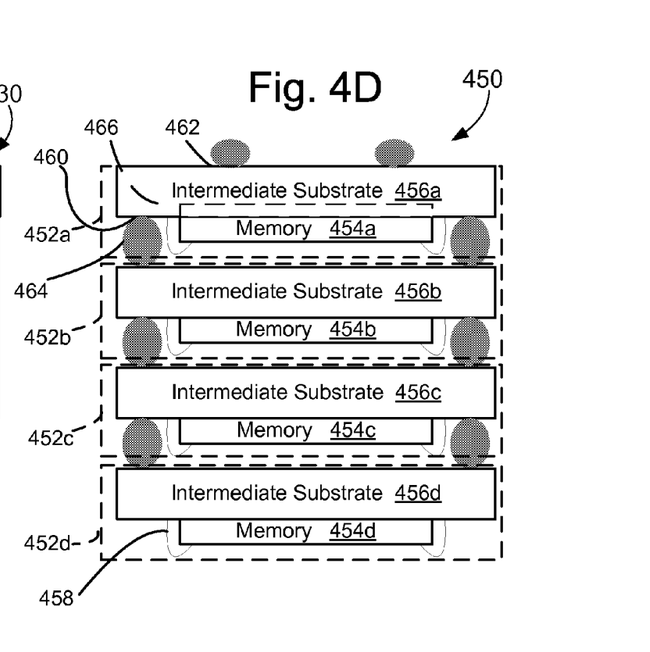

A memory stack may also employ a package-on-package (POP) architecture, as shown at 450 in FIG. 4D. The assembly generally comprises a stack of separate but interconnected packages 452a-452d (in phantom). The packages include respective memory devices 454a-454d that mount to separate individual intermediate substrates 456a-456d. Wire bonds 458 couple each device to the intermediate substrate. Each intermediate substrate includes arrays of contact pads 460 and 462 disposed on each opposite side to enable solder balls 464 to interconnect each package. In an optional configuration, each intermediate substrate is formed with a rectangular depression 466 (in phantom) designed to receive at least a portion of, for example memory device 454a. In this manner, the height of the memory device above the intermediate substrate is reduced, correspondingly reducing the height of the overall assembly (and the length of the wire bond).

Referring again back to FIG. 1, the logic circuitry 160 in one embodiment incorporates a contact interface, such as a ball grid array (BGA) that mounts to the contact array 118 disposed on the top face 116 of the first substrate 102. As noted earlier, the logic circuitry may take many forms, including circuitry employed in an ASIC, or Field Programmable Gate Array (FPGA) device, or as on-chip control logic for a host processor. In some embodiments, the logic circuitry includes memory control logic to interface between a separate host processor (not shown) and the memory stack 140. As noted earlier, command, control, data, and clock signals propagate directly between the logic circuitry and the memory stack through the remaining layers of the substrate to minimize latency. Non-memory device signals such as power, ground, and signals from the host processor may be routed directly between the PCB substrate 180 and the logic circuitry.

With continued reference to FIG. 1, by mounting the logic circuitry 160 atop the packaged device assembly 100, cooling structures may be straightforwardly applied to facilitate cooling of the logic. This is especially important for high-power applications where the logic circuitry expends significant power during memory transactions. To address this, the assembly employs a metallic hollowed bracket 164 configured to thermally contact the top surface 166 of the logic. An air-cooled heatsink 168 formed with a plurality of cooling fingers 170 thermally rests atop the bracket to draw heat away from the logic during operation. In a similar manner, the memory stack 140 may include a layer of thermal interface material (TIM) 172 to draw heat away from the memory devices and towards the PCB substrate 180.

The packaged semiconductor device 100 described above lends itself well to a variety of applications where it may be installed on a second substrate such as the PCB 180. The second substrate may be a mother board in a personal computer, or a graphics card board, or a main board for a game console. In low-power applications, the second substrate may form the main board in a cell phone or other hand-held consumer device.

Figure 5:
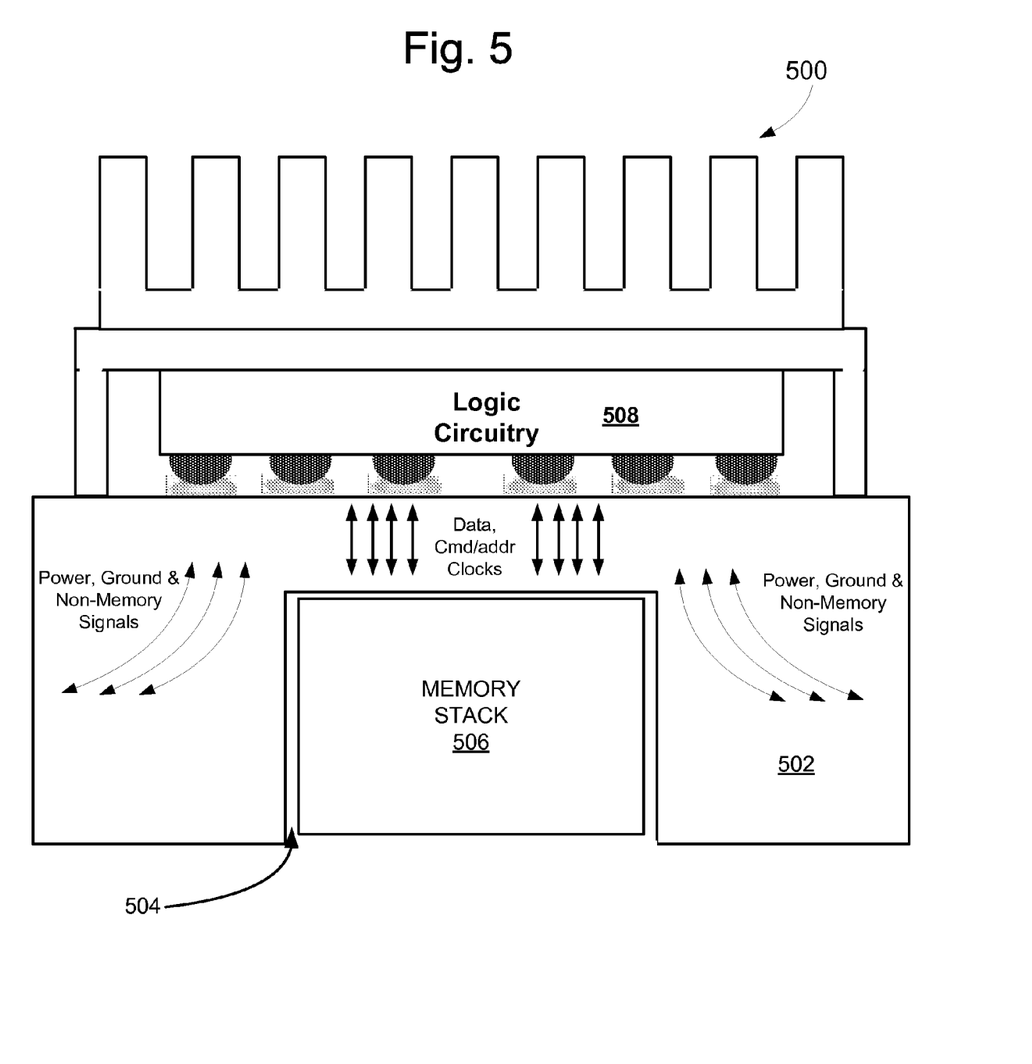
FIG. 5 illustrates a cross-sectional view of an alternate embodiment of a packaged semiconductor device.

Referring now to FIG. 5, a further embodiment of a packaged semiconductor system 500 merges the above-described first and second substrates 102 and 180 into a single substrate 502. The substrate includes multiple layers with vias interconnecting the various layers, and a formed cavity 504. A memory stack 506 nests inside the cavity in proximal relationship to a memory controller in the form of logic circuitry (such as an ASIC, or FPGA, or host processor, 508). As shown in the figure, signals relating to memory transactions, such as data, command/address, and timing reference signals (such as clocks, strobes, and the like) propagate a very short distance between the memory stack and the memory controller, while other signals such as power, ground, and host-related signals route along paths outside of the memory stack profile. This particular implementation is well-suited to low power cell phone applications, where modification of the main board to support such an architecture is relatively straightforward.

Those skilled in the art will appreciate the many benefits and advantages afforded by the embodiments disclosed herein. By positioning the memory stack proximate the memory controller in a packaged device, significant latency reductions associated with read and write transactions may be realized. Moreover, by nesting the memory stack inside the substrate, and stacking the controller above the location of the stack, the controller may be set in an exposed position amenable to cooling through heatsinks or the like.

It should be noted that the various circuits disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit expressions may be implemented include, but are not limited to, formats supporting behavioral languages such as C, Verilog, and VHDL, formats supporting register level description languages like RTL, and formats supporting geometry description languages such as GDSII, GDSIII, GDSIV, CIF, MEBES and any other suitable formats and languages. Computer-readable media in which such formatted data and/or instructions may be embodied include, but are not limited to, non-volatile storage media in various forms (e.g., optical, magnetic or semiconductor storage media) and carrier waves that may be used to transfer such formatted data and/or instructions through wireless, optical, or wired signaling media or any combination thereof. Examples of transfers of such formatted data and/or instructions by carrier waves include, but are not limited to, transfers (uploads, downloads, e-mail, etc.) over the Internet and/or other computer networks via one or more data transfer protocols (e.g., HTTP, FTP, SMTP, etc.).

When received within a computer system via one or more computer-readable media, such data and/or instruction-based expressions of the above described circuits may be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image may thereafter be used in device fabrication, for example, by enabling generation of one or more masks that are used to form various components of the circuits in a device fabrication process.

In the foregoing description and in the accompanying drawings, specific terminology and drawing symbols have been set forth to provide a thorough understanding of the present invention. In some instances, the terminology and symbols may imply specific details that are not required to practice the invention. For example, any of the specific numbers of bits, signal path widths, signaling or operating frequencies, component circuits or devices and the like may be different from those described above in alternative embodiments. Also, the interconnection between circuit elements or circuit blocks shown or described as multi-conductor signal links may alternatively be single-conductor signal links, and single conductor signal links may alternatively be multi-conductor signal links. Signals and signaling paths shown or described as being single-ended may also be differential, and vice-versa. Similarly, signals described or depicted as having active-high or active-low logic levels may have opposite logic levels in alternative embodiments. Component circuitry within integrated circuit devices may be implemented using metal oxide semiconductor (MOS) technology, bipolar technology or any other technology in which logical and analog circuits may be implemented. With respect to terminology, a signal is said to be "asserted" when the signal is driven to a low or high logic state (or charged to a high logic state or discharged to a low logic state) to indicate a particular condition. Conversely, a signal is said to be "deasserted" to indicate that the signal is driven (or charged or discharged) to a state other than the asserted state (including a high or low logic state, or the floating state that may occur when the signal driving circuit is transitioned to a high impedance condition, such as an open drain or open collector condition). A signal driving circuit is said to "output" a signal to a signal receiving circuit when the signal driving circuit asserts (or deasserts, if explicitly stated or indicated by context) the signal on a signal line coupled between the signal driving and signal receiving circuits. A signal line is said to be "activated" when a signal is asserted on the signal line, and "deactivated" when the signal is deasserted. Additionally, the prefix symbol "/" attached to signal names indicates that the signal is an active low signal (i.e., the asserted state is a logic low state). A line over a signal name (e.g., '<signalname>') is also used to indicate an active low signal. The term "coupled" is used herein to express a direct connection as well as a connection through one or more intervening circuits or structures. Integrated circuit device "programming" may include, for example and without limitation, loading a control value into a register or other storage circuit within the device in response to a host instruction and thus controlling an operational aspect of the device, establishing a device configuration or controlling an operational aspect of the device through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. The term "exemplary" is used to express an example, not a preference or requirement.

While the invention has been described with reference to specific embodiments thereof, it will be evident that various modifications and changes may be made thereto without departing from the broader spirit and scope of the invention. For example, features or aspects of any of the embodiments may be applied, at least where practicable, in combination with any other of the embodiments or in place of counterpart features or aspects thereof. Accordingly, the specification and drawings are to be regarded in an illustrative rather than a restrictive sense.

I claim:

1. A packaged semiconductor device comprising:
   a substrate having multiple layers between first and second oppositely disposed faces, and a cavity with an opening at the first face to nest multiple integrated circuit memory device therein, the multiple integrated circuit memory devices stacked vertically, the first face having electrical contacts formed thereon;
   logic circuitry disposed on the second face of the package substrate and having contacts for electrically coupling to the multiple integrated circuit memory device, the logic circuitry further coupled to the electrical contacts on the first face through first electrical paths formed in the multiple layers of the substrate, the first electrical paths including conductive traces and vias.

2. The packaged semiconductor device according to claim 1 wherein the package substrate comprises a laminate structure.

3. The packaged semiconductor device according to claim 1 wherein the package substrate comprises a silicon interposer.

4. The packaged semiconductor device according to claim 1 wherein the package substrate comprises one or more of a group of materials consisting of a ceramic material and polyimide.

5. The packaged semiconductor device according to claim 1 wherein the electrical contacts on the first face of the package substrate are to interface between the logic circuitry and a printed circuit board.

6. The packaged semiconductor device according to claim 1 wherein the cavity is rectangularly shaped.

7. The packaged semiconductor device according to claim 1 wherein the cavity is formed as a channel extending longitudinally across the substrate.

8. The packaged semiconductor device according to claim 1 wherein the package substrate includes a contact interface disposed in the cavity to route signals between the multiple integrated circuit memory devices and the package substrate.

9. The packaged semiconductor device according to claim 8 wherein the multiple integrated circuit memory device form a stack that is flip-chip mounted to the contact interface.

10. The packaged semiconductor device according to claim 1 wherein the cavity extends from the first face to the second face, and the multiple integrated circuit memory device form a stack that couples directly to the logic circuitry.

11. The packaged semiconductor device according to claim 1 wherein the logic circuitry comprises a logic integrated circuit device flip-chip mounted to the second face.

12. The packaged semiconductor device according to claim 1 wherein the package substrate further includes a flip-chip interposer formed on the second face.

13. The packaged semiconductor device according to claim 1 wherein the multiple integrated circuit memory device comprises multiple integrated circuit memory devices interconnected by through-silicon vias.

14. The packaged semiconductor device according to claim 1 wherein the multiple integrated circuit memory device comprises multiple integrated circuit memory devices, the integrated circuit memory devices being disposed in respective individual packages, and wherein the individual packages are stacked in a package-on-package configuration.

15. The packaged semiconductor device according to claim 14 wherein each of the individual packages includes a substrate formed with a depression, and each of the plurality of integrated circuit memory devices is mounted in the depression and wire bonded to the package substrate in the corresponding individual package.

16. The packaged semiconductor device according to claim 1 wherein the cavity cuts through a first number of the multiple layers and leaves a remaining number of the multiple layers intact, and wherein the logic circuitry is to electrically couple to the multiple integrated circuit memory device through second electrical paths formed in the remaining number of the multiple layers of the substrate.

17. The packaged semiconductor device according to claim 1 wherein the electrical contacts formed on the first face are for coupling to a circuit board, wherein power and ground signals are routed between the circuit board and the logic circuitry via the package substrate, and read/write data and command signals are routed between the at least one integrated circuit memory devices and the logic circuitry via the package substrate.

18. The packaged semiconductor device according to claim 1 wherein the logic circuitry comprises a memory controller and the multiple integrated circuit memory devices comprises at least one dynamic random access memory device.

19. A system comprising:
- a package substrate having multiple layers between first and second oppositely disposed faces and a cavity with an opening at the first face, the first face having an array of electrical contacts formed thereon;
- multiple integrated circuit memory device nested in the cavity; and
- logic circuitry disposed on the second face and having first contacts electrically coupled to the at least one integrated circuit memory device through first electrical paths formed in the package substrate and second contacts electrically coupled to the array of electrical contacts on the first face of the substrate through second electrical paths formed in the package substrate, the first paths to route high speed signals including read/write data and commands between the at least one integrated circuit memory device and the logic circuitry, the second path to route low speed signals including power and ground between the logic circuitry and the array of electrical contacts on the first face of the substrate.

20. The system according to claim 19 wherein the package substrate comprises a structure from the group comprising a laminate, silicon interposer, ceramic, or polyimide.

21. The system according to claim 19 wherein the cavity is rectangularly shaped.

22. The system according to claim 19 wherein the cavity is formed as a channel extending longitudinally across the substrate.

23. The system according to claim 19 wherein the package substrate includes a contact interface disposed in the cavity to route signals between the multiple integrated circuit memory device and the package substrate.

24. The system according to claim 23 wherein the multiple integrated circuit memory device from a stack that is flip-chip mounted to the contact interface.

25. The system according to claim 19 wherein the cavity extends from the first face to the second face, and the multiple integrated circuit memory device from a stack that couples directly to the logic circuitry in a face-to-face configuration.

26. The system according to claim 19 wherein the logic circuitry comprises a logic integrated circuit device flip-chip mounted to the second face.

27. The system according to claim 19 wherein the substrate further includes a flip-chip interposer formed on the second face.

28. The system according to claim 19 wherein the logic circuitry comprises a memory controller, and the at least one integrated circuit memory device comprises multiple dynamic random access memory device.

* * * * *